United States Patent [19]

Davis

[11] Patent Number: 5,576,559

[45] Date of Patent: Nov. 19, 1996

[54] HETEROJUNCTION ELECTRON TRANSFER DEVICE

[75] Inventor: Gary A. Davis, Fremont, Calif.

[73] Assignee: Intevac, Inc., Santa Clara, Calif.

[21] Appl. No.: 332,880

[22] Filed: Nov. 1, 1994

[51] Int. Cl.⁶ .................................................. H01L 27/14
[52] U.S. Cl. .......................... 257/191; 257/185; 257/655; 257/458
[58] Field of Search ............................ 257/191, 21, 185, 257/196, 458, 656, 657, 655

[56] References Cited

U.S. PATENT DOCUMENTS

| | | | |
|---|---|---|---|
| 3,958,143 | 5/1976 | Bell | 313/94 |
| 4,518,979 | 5/1985 | Dumke et al. | 257/185 |
| 4,839,706 | 6/1989 | Brennan | 257/185 |
| 5,047,821 | 9/1991 | Costello et al. | 257/185 |

OTHER PUBLICATIONS

Measurement of the conduction–band discontinuity of molecular beam epitasial grown . . . profiling by People et al. Appl. Phys. Lett. 43(1), 1 Jul. 1983.

Structural & optical properties of GaAlInAs lattice matched to InP grown by low–pressure metalorganic vapor phase epitaxy, by Davies et al. Appl. Phys. Lett. 53 (4) 25 Jul. 1988.

Measurement of AlAs/InP and InP/$In_{0.52}Al_{0.48}As$ heterojunction band offsets by x–ray photoemission spectroscopy by Waldrop et al. J. Vac. Sci. Technol. B 8 (4), Jul./Aug. 1990.

Primary Examiner—Peter Toby Brown
Assistant Examiner—David B. Hardy
Attorney, Agent, or Firm—Stanley Z. Cole

[57] ABSTRACT

A smooth and monotonic potential energy gradient was established at a p-type (InGa)As—undopad InP heterojunction to efficiently transfer conduction electrons from the (InGa)As:p layer to the InP:ø layer. This potential energy gradient was established with a compositionally graded p-type semiconductor alloy layer and an n-type InP built-in field layer interposed at the heterojunction. The compositionally graded semiconductor alloy layer spatially distributes the conduction band discontinuity of the (InGa)As—InP heterojunction and the InP:n built-in field layer eliminates potential energy barriers from the conduction band over a wide range of externally-applied biases including no externally applied bias. The smooth and monotonic potential energy gradient thus established promotes efficient transfer of the conduction electrons due to drift from the (InGa)As:p layer to the large bandgap InP collector layer where they contribute to the output current of any number of electronic devices. The utility of this potential energy grading structure was demonstrated in a transferred-electron photocathode device wherein the efficient transfer of photoelectrons from the (InGa)As:p absorber layer to the InP:ø electron-transfer layer has been utilized. This structure has utility in a number of electronic devices requiring such electron transfer across an (InGa)As:p—InP:ø heterojunction including p-i-n photodetectors and heterojunction bipolar transistors.

21 Claims, 4 Drawing Sheets distance from heterojunction (Å)

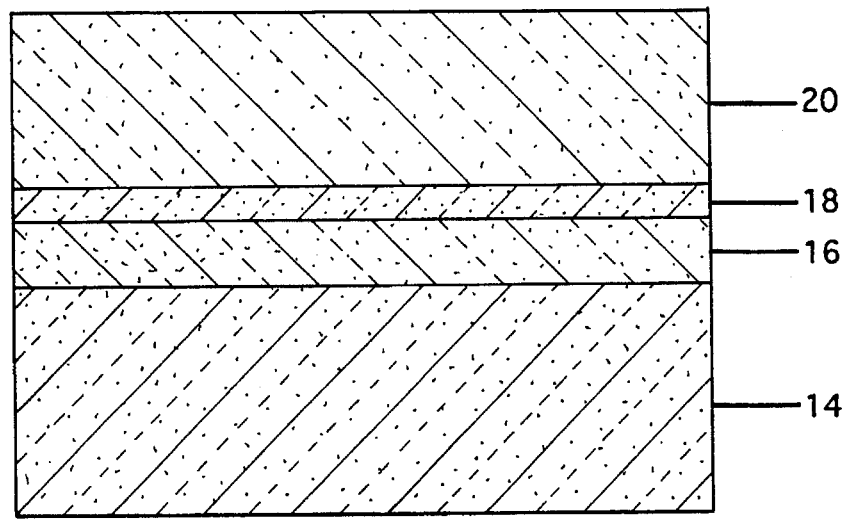
FIG. 1
FIG. 2
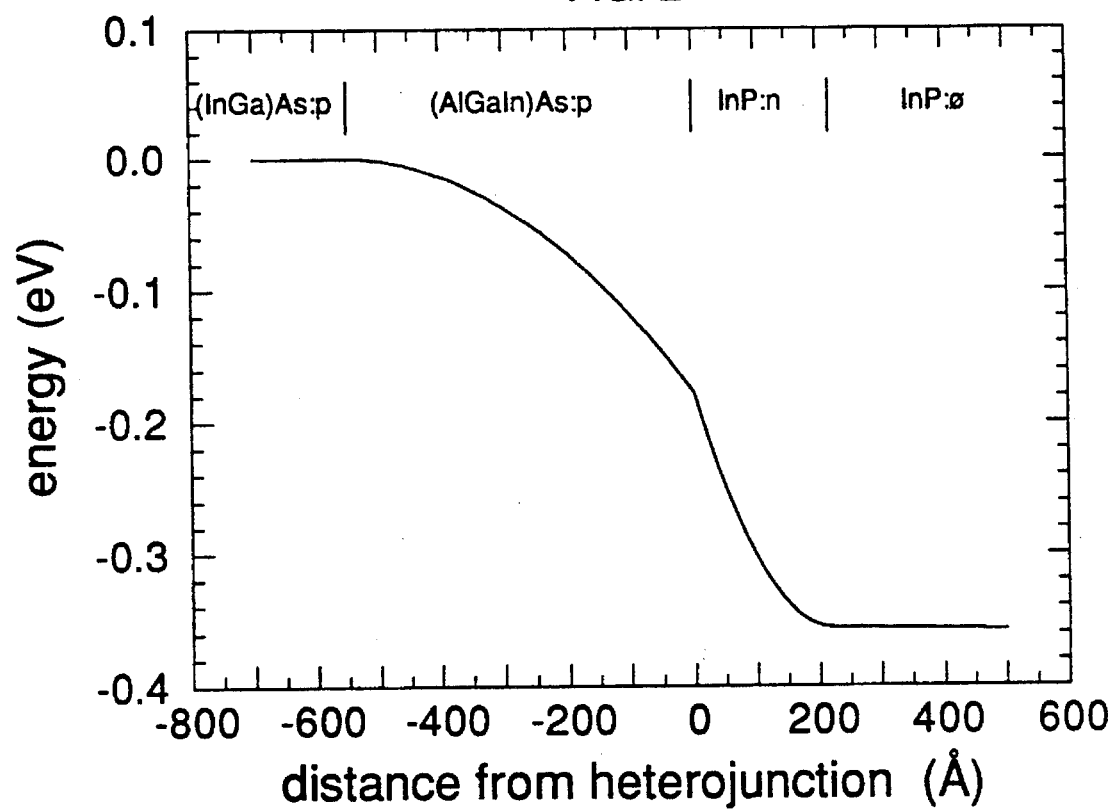

HETEROJUNCTION ELECTRON TRANSFER DEVICE

BACKGROUND OF THE INVENTION

1. Field of the Invention

This invention relates to (InGa)As-lnP heterojunction devices utilizing a InP:ø collector to extract electrons from a (InGa)As:p layer and more particularly to heterojunction devices having a smooth and monotonic potential energy gradient at the heterojunction for establishing drift of the conduction electrons from the (InGa)As:p layer to the InP:ø layer.

2. Description of the Prior Art

Heretofore, the efficient transfer of electrons from (InGa)As:p to InP:n has been achieved in the collector junction of heterojunction bipolar transistors through the use of grading layers to smooth the conduction band discontinuity. These devices rely on the built-in field of the extrinsic heavily-doped (InGa)As:p base and InP:n collector or on externally-applied reverse biases of the heavily doped base-collector junction to provide the electric field necessary to remove the conduction-band barriers at the junction. While these devices provide a smooth and monotonic variation in the conduction band at the heterojunction, they are limited in use to extrinsic p-n heterojunctions which can support a sufficiently large electric field. The incorporation of a intrinsic layer into this junction, as may be desired for instance to reduce the base-collector capacitance, would decrease the electric field at the junction and cause the formation of potential energy barriers to the conduction electrons.

The application of any such grading structure to (InGa)As photodetectors has not been reported. Conventional p-i-n (InGa)As-InP photodetectors utilize a low-doped (InGa)As absorbing layer and extrinsic n- and p-type InP contact layers to circumvent problems associated with the conduction and valence band discontinuities. This approach precludes the use of thick InP:ø layers which would trap photogenerated electrons at the band discontinuity and greatly reduce the efficiency of the photodiode. The insertion of a thick intrinsic region is necessary to reduce the junction capacitance and improve the frequency response of the photodiode. Conventional photodiodes rely on the depletion of the (InGa)As absorber region to reduce the junction capacitance. This approach requires the use of large applied voltages to deplete the absorber layer due to its residual doping background and results in large dark currents due to thermally generated electrons in the small bandgap depletion region.

SUMMARY OF THE INVENTION

It is therefore an object of this invention to provide an efficient means of transferring electrons from an extrinsic (InGa)As:p layer to a InP:ø collector layer.

It is a further object of this invention to reduce the capacitance of (InGa)As:p—InP:n and (InGa)As:p—InP:p heterojunctions through the use of a depleted InP:ø layer without significantly degrading the efficient transfer of conduction electrons from the (InGa)As:p to the InP layers or increasing the thermally generated current associated with depleted low-bandgap layers.

It is another object of this invention to provide a (InGa)As:p—InP:ø—InP:n structure which efficiently transfers conduction electrons from the (InGa)As:p layer to the InP:n layer with no externally applied bias.

It is another object of this invention to provide a (InGa)As:p—InP:ø—InP:p structure which efficiently transfers conduction electrons from the (InGa)As:p layer to the InP:p layer with small externally applied biases.

Briefly, these and other objectives are achieved by interposing a semiconductor alloy grading layer and an n-type InP built-in field layer between the (InGa)As:p layer and the InP:ø layer of the heterojunction device. Starting with the crystalline (InGa)As:p layer of the junction, a p-type semiconductor alloy layer is grown in which the composition of the alloy is controlled so that the electron affinity of the alloy gradually varies from that of the (InGa)As:p layer to that if the InP:ø layer. Examples of semiconductor alloy systems appropriate for this layer include $In_xGa_{1-y}As_{1-y}P_y$ and $(Al_sGa_{1-s})_{1-t}In_tAs$ where x and y or s and t, the alloy constituent fractions, are varied to yield the proper electron affinity variations. The two alloy fraction variables in these quaternary alloys provide for the required variation in electron affinity with an additional degree of freedom provided to meet other growth constraints. An example of such an additional constraint might be the requirement that a uniform lattice constant be maintained throughout the grading layer growth. Following the growth of the alloy grading layer, an n-type InP layer is grown to provide the built-in field, and the undoped InP collector layer is grown. The dopant concentration in the p-type alloy grading layer and the n-type InP built-in field layer, the thicknesses of these layers, and the profile of the compositional variation with position in the alloy grading layer are all chosen such that the conduction band energy exhibits a gradual decrease from the (InGa)As:p layer to the InP:ø layer under the influence of any externally applied voltages to be used in the final device operation. Generally this will require that both the semiconductor alloy grading layer and the InP:n built-in field layer are fully depleted with a gradual drop in the conduction band energy from the (InGa)A:p to the InP:ø with no externally applied voltages. Additional layers may be grown on the InP:ø layer as dictated by the final device design. Conversely, this invention could be implemented by starting with the InP:ø layer and reversing the order of deposition of the layers and the alloy constituent profile of the alloy grading layer.

The smooth, monotonic drop in conduction band energy from the (InGa)As:p layer to the InP:ø layer caused by the variations in the composition of the alloy grading layer and the fixed charge resulting from the ionized dopants in the semiconductor alloy layer and the InP:n built-in field layers is evidence of an electrochemical field which causes the drift of electrons from the (InGa)As:p layer to the InP:ø layer. (InGa)As:p conduction electrons encountering this region of the structure will be swept across the interstitial layers due to this field with minimal loss of conduction electrons due to trapping at potential barriers or recombination in this region. In this manner conduction electrons are efficiently transferred from the small bandgap extrinsic (InGa)As:p to the large bandgap intrinsic InP:ø collector which can be utilized to reduce the junction capacitance without excessive contribution to the thermally generated collected current. The extraction of electrons from the (InGa)As:p layer will provide a diffusion current in the (InGa)As:p layer which will additionally assist the flow of conduction electrons from the bulk of this extrinsic layer. Conduction electrons introduced through photoabsorption throughout the bulk of the (InGa)As layer or introduced at a buried junction through the application of a forward bias, as in a heterojunction bipolar transistor, are directed to the heterojunction under the influence of a diffusion current and through the heterojunction under the influence of a drift current.

While the utility of the present invention is directed primarily to the efficient transfer of electrons at (InGa)As/InP heterojunctions, the most general form of this invention is applicable to a wide variety of semiconductor heterojunctions. The present invention has application to any heterojunction wherein it is desired to efficiently transfer electrons from a small-bandgap, large electron affinity p-type semiconductor to a large-bandgap, small electron affinity undoped or n-type semiconductor. The implementation of this invention requires only that a gradually graded alloy or virtual alloy be grown at the heterojunction which provides electron affinity matches to the two semiconductor materials. Examples of heterojunction systems which are appropriate for this invention include the GaAs/(AlGa)As and GaAs/(InGa)P systems.

BRIEF DESCRIPTION OF THE DRAWINGS

Further objects and advantages of the present invention and the cause and operation of the gradient of potential energy will become apparent from the following description taken in conjunction with the drawings in which:

FIG. 1 is an schematic sectional view of the invention,

FIG. 2 is an energy level diagram of the conduction band in an implementation of this invention having a quadratic dependence of the alloy composition on position in the graded region under the condition of zero externally applied bias.

DESCRIPTION OF THE PREFERRED EMBODIMENTS

Figure 3:
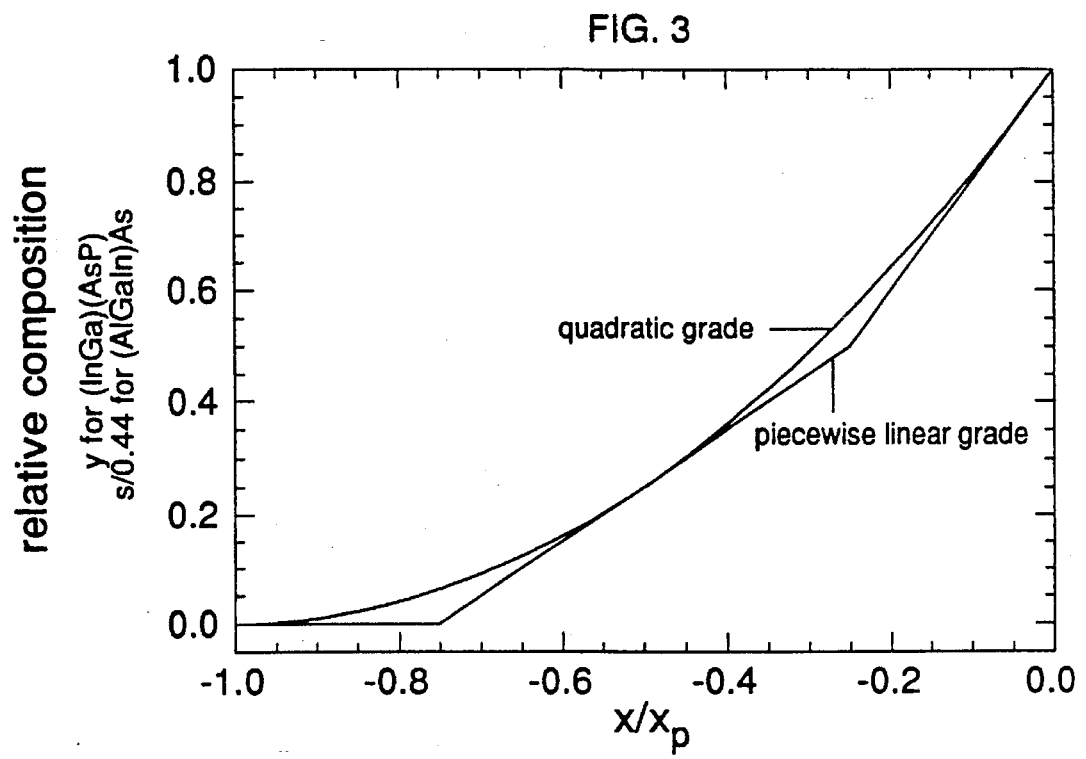
FIG. 3 is a comparison of the quadratic and piecewise linear alloy composition grading profiles.

Referring now to FIG. 1 there is shown the schematic sectional view of the present invention including the semiconductor alloy grading layer 16 and the InP:n built-in field layer 18 interposed at the junction between the p-type (InGa)As layer 14 and the undoped InP layer 20. The grading layer in this structure is comprised of a semiconductor alloy whose composition can be adjusted to yield an electron affinity equal to that of the large band gap material such as InP for one composition and that of the small band gap material such as (InGa)As for another composition subject to any other constraints imposed by the growth process or device design. For the purposes of this discussion of the preferred embodiments, it will be assumed that maintaining a lattice match to InP is such a constraint although this may not be rigidly required of this invention. The $In_xGa_{1-y}As_{1-y}P_y$ and $(Al_sGa_{1-s})_{1-t}In_tAs$ alloy systems both are appropriate for this invention. In the $In_xGa_{1-y}As_{1-y}P_y$ system, the constraint of maintaining a lattice match to InP can be met if the group III and group V compositions are related by $x=0.532+0.468\ y$, and the alloy can have an electron affinity which is equal to that of InP for $y=1$ and equal to that of lattice-matched $In_{0.532}Ga_{0.468}As$ for $y=0$. While this material system presents the easiest conceptualization of the present invention, it suffers from current technological limitations in that it is difficult to maintain lattice-matched grades over the group V compositional range $0 \leq y \leq 1$ and the incorporation of dopants into the alloy varies drastically with alloy composition. In the $(Al_sGa_{1-s})_{1-t}In_tAs$ alloy system, a lattice match to InP can be maintained approximately for a indium fraction of 0.532 independent of the relative compositions of aluminum and gallium. The lattice-matched alloy has an electron affinity equal to that of $In_{0.532}Ga_{0.468}As$ for the composition $s=0$ and an electron affinity equal to that of InP for the composition $s=0.44$. This value of the composition for an electron affinity match to InP is determined from the 0.16eV valence band offset between lattice matched (InAl)As and InP, the 0.50eV conduction band offset between (InAl)As and (InGa)As, and the linear dependence of bandgap energy on aluminum partial fraction, s, in this alloy system. Regardless of the accuracy of the identification of the composition $s=0.44$ as that which yields an electron affinity match to InP, it is clear that this alloy will have an electron affinity match to InP for some lattice-matched composition. This alloy system is readily grown over the composition ranges appropriate for the current invention and exhibits uniform dopant incorporation over this compositional range under reasonable growth conditions. The bandgap energy for a lattice-matched alloy composition $s=0.44$ is 1.07eV leaving a valence-band discontinuity of 0.28eV to the InP:ø layer. This valence-band discontinuity has no effect on the function of the present invention. An additional method of implementing the semiconductor grading layer 16 is to utilize a superlattice having spatially varying layer thicknesses to produce a virtual alloy having the desired gradual change in electron affinity. For example, a superlattice consisting of (InGa)As:p wells and InP:p barriers could be used with gradually varying layer thicknesses to implement the desired electron affinity variation. Near the (InGa)As p-type layer such a superlattice would consist of relatively thick wells and thin barriers to yield a virtual alloy which is arbitrarily close in electron affinity match to the (InGa)As layer. Near the end of the graded region, the superlattice would consist of relatively thin wells and thick barriers to yield a close electron affinity match to InP. In the intervening region, the well and barrier thicknesses would be varied to yield a virtual alloy having the desired electron affinity profile appropriate for this invention.

The ability to spatially distribute the conduction band discontinuity constitutes one requirement of the present invention. Another requirement is the ability to provide an electrostatic potential energy which at all positions in the grading layer overcomes the chemical potential energy either through building-in such an electrostatic potential or through the application of external biases. In this way, there is a gradual decrease in the electrochemical potential for conduction electrons passing from the (InGa)As:p to the InP:ø. In the preferred embodiment of the present invention, an adequate electrostatic potential is provided by the equilibrium depletion of the InP:n built-in field layer so that no external bias is required to eliminate conduction band barriers to the drift of electrons from the (InGa)As to the InP. This embodiment necessitates the thickness of the grading layer being less than or equal to the depletion depth into the p-type layer caused by the InP:n built-in field layer and additional layers of the total device structure, and that the InP:n built-in field layer is fully depleted under the condition of no applied bias. For example, if a uniform acceptor concentration of $2\times10^{17}$ cm$^{-3}$ is used in the grading layer and a uniform donor concentration of $5\times10^{17}$ cm$^{-3}$ is used in the InP:n built-in-field layer, the depletion depths will be approximately 550 Å, into the grading layer and 220 Å into the built-in field layer. Under these conditions, a grading layer which is less than or equal to 550 Å, thick and a built-in field layer which is 220 Å thick are appropriate. Such a junction provides a built-in potential of 0.87V, of which 0.40V drops across the graded region. This net electrostatic potential energy drop of 0.40eV is more than sufficient to overcome the 0.22eV net chemical potential energy increase in the graded region.

In order to ensure that the electrostatic potential energy overcomes the chemical potential energy contribution in the conduction band at all points in the graded layer, the profile of the graded region composition with position must be well behaved. Under the typical depletion approximation the electrostatic potential varies with position in a quadratic dependence:

$$\Delta E_{es}(x) = -q\psi(x) = -\frac{q^2 N_a}{2\epsilon_p} x_p^2 \left(1 + \frac{x}{x_p}\right)^2 = -\alpha \left(1 + \frac{x}{x_p}\right)^2$$

Here q is the electron charge, $N_a$ is the acceptor concentration and $\epsilon$ p is the relative permittivity of the grading layer (both assumed to be constant), $x_p$ is the depletion depth in the grade, and x is the position in the grade with $-x_p \leq x \leq 0$. The quantity $\alpha$ is equal to the net electrostatic potential energy drop across the graded region due to depletion: for the example cited above it has a value of 0.40eV. If the chemical potential energy follows the same functional form but has a smaller magnitude than the electrostatic potential energy then the electrochemical potential energy will exhibit the gradual decrease in going from the (InGa)As to the InP which is key to the present invention. Hence an (AlGaIn)As grade having the composition profile $$s = 0.44 \left(1 + \frac{x}{x_p}\right)^2$$

or an (InGa)(AsP) grade having the profile $$y = \left(1 + \frac{x}{x_p}\right)^2$$

will give an electrochemical potential for conduction electrons of $$\Delta E_{ch} = \beta \left(1 + \frac{x}{x_p}\right)^2$$

where here $\beta$ is the net chemical potential energy difference across the graded region (equivalently, the conduction energy band discontinuity or electron affinity difference between (InGa)As and InP) and is equal 0.22eV for the lattice-matched alloy. The electrochemical energy for conduction electrons in the graded region under this grading scheme is then $$\Delta E_c(x) = \Delta E_{es}(x) + \Delta E_{ch}(x) = -(\alpha - \beta) \left(1 + \frac{x}{x_p}\right)^2$$

which exhibits the desired gradual decrease in conduction band energy. This behavior is shown in FIG. 2 which is a conduction band energy diagram for the structure presented in FIG. 1 with the dopant concentrations and quadratic alloy composition profile stated above. In this figure the (InGa)As layer is in the region $x<-550$ Å, the alloy grading layer is in the region $-550$ Å$<x<0$, the depleted InP:n layer is in the region $0<x<220$ Å, and the undoped InP:ø layer is in the region $x>220$ Å. This band diagram is for the case of no externally applied biases and clearly shows the 0.18eV potential energy drop for conduction electrons going from the (InGa)As to the heterojunction at $x=0$ and an additional 0.18eV potential energy drop for conduction electrons going from the edge of the heterojunction to the edge of the built-in field layer at $x=220$ Å. The former 0.18eV potential energy drop is merely the net electrochemical potential energy drop $\alpha$-$\beta$ stated above.

While quadratic compositional grades are clearly sufficient for the graded alloy region of the present invention, they are not necessary and are non-trivial to implement during the structure growth. Numerous other suitable grading profiles are readily conceived which will create the desired effect of a smooth monotonic drop in the electrochemical potential for conduction electrons. One example of such an alternate composition profile is the piecewise linear profile defined as

Figure 4:
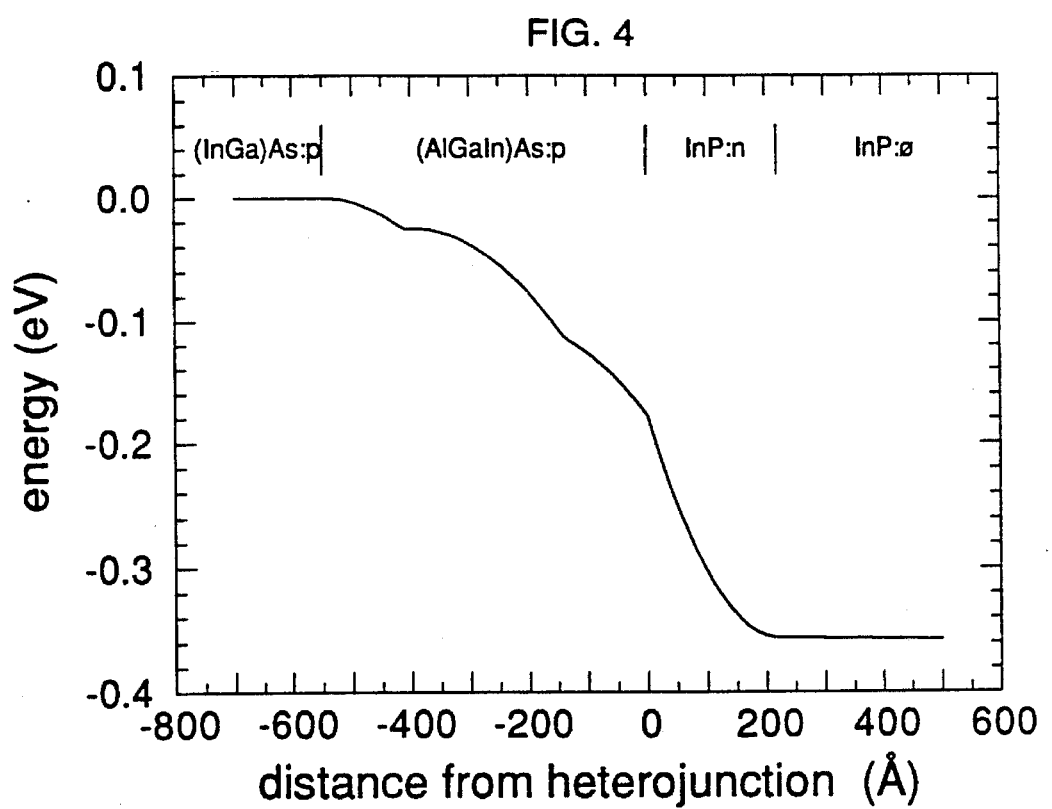
FIG. 4 is an equilibrium energy level diagram of the conduction band in an implementation of this invention having a piecewise linear dependence of the alloy composition on position in the graded region under the condition of zero externally applied bias.

| | |
|---|---|
| y' = 0 | $-x_y < x < -\frac{3}{4} x_p$ |
| y' graded linearly from | y' = 0.0 at $x = -\frac{3}{4} x_p$ |
| to | y' = 0.5 at $x = -\frac{1}{4} x_p$ |
| y' graded linearly from | y' = 0.5 at $x = -\frac{1}{4} x_p$ |
| to | y' = 1.0 at $x = 0$ | where y'=y for (InGa)(AsP) grades and y'=s/0.44 for (AlGaIn)As grades. This profile is presented graphically in FIG. 3 along with the profile of the quadratic grade. The piecewise linear profile is a simple approximation to the quadratic profile. The calculated conduction band energy diagram for the present invention utilizing a piecewise linear alloy composition grade is shown in FIG. 4. This energy band diagram exhibits a smooth monotonic potential energy drop with a few kinks associated with changes in the rate of change of the composition with position, but exhibits no potential barriers.

An alternative approach to this invention is to use the final portion of the graded region serve as the built-in field layer rather than using an InP:n layer. In this approach the graded layer, layer 16 of FIG. 1, would consist of a partial grade of p-type alloy and the built-in field layer, layer 18 of FIG. 1, would consist of the remainder of the alloy grade having n-type doping. This approach has the advantage of keeping all of the electrostatic potential drop in the region where the chemical potential increase is occurring rather than having a portion of the electrostatic potential drop occur in a region of constant chemical potential.

Figure 5:
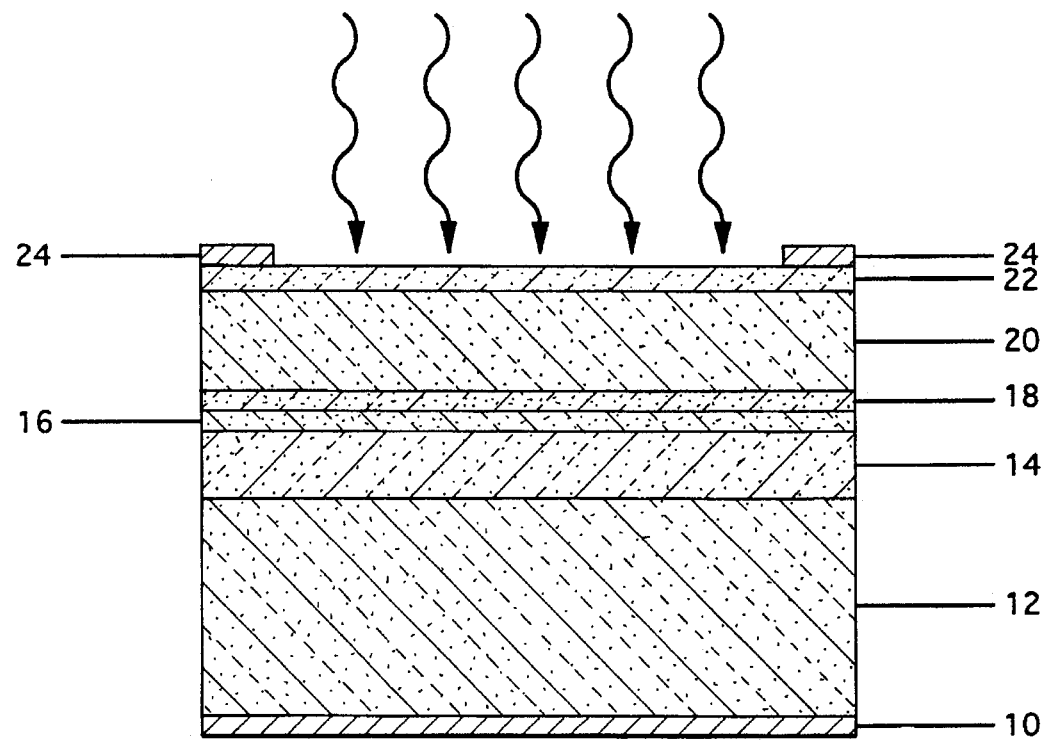
FIG. 5 is a schematic sectional view of a p-i-n photodiode structure incorporating the invention.
Figure 6:
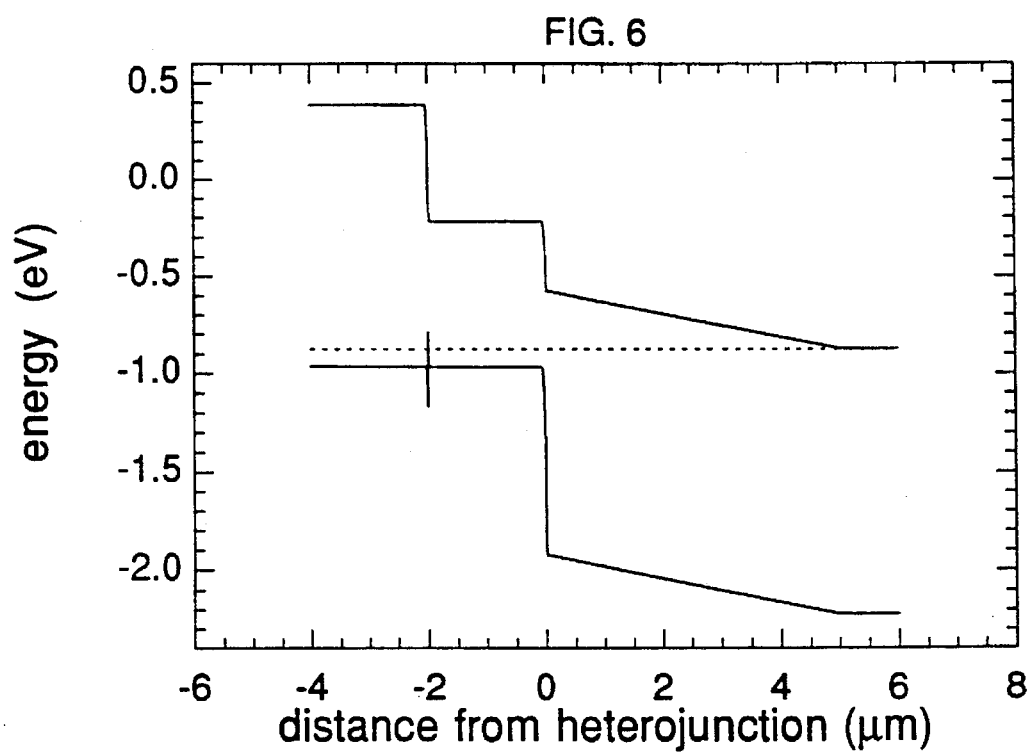
FIG. 6 is an energy level diagram of the p-i-n diode of FIG. 4 under the condition of zero externally applied bias.
Figure 7:
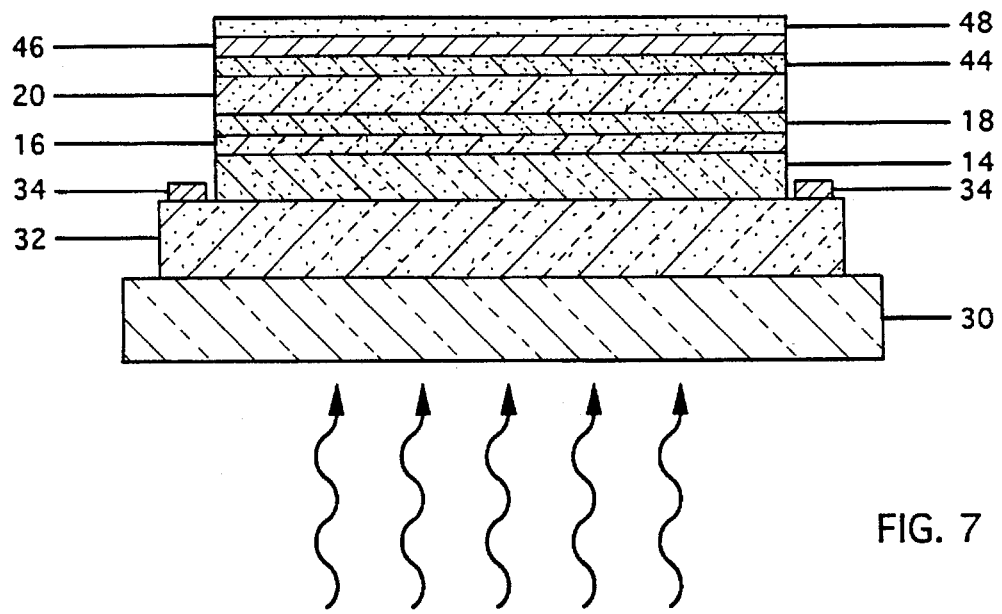
FIG. 7 is a schematic sectional view of a transferred electron photocathode structure incorporating the invention.

The application of the present invention to a p-i-n photodiode structure and a transferred-electron photocathode structure are shown in schematic cross-section in FIG. 5 and FIG. 7 respectively. In FIG. 5 is shown the back-surface contact 10, InP:p substrate 12, (InGa)As absorber layer 14, semiconductor alloy grading layer 16, built-in field layer 18, InP:ø drift region 20, InP:n+ contact layer 22, and top surface ohmic contact metal 24. Light which is incident on the top layer of this structure will generate photoelectrons in the (InGa)As absorber layer 14 which must pass through the InP:ø drift layer to contribute to the photocurrent of the device. The present invention provides efficient transfer of the photoelectrons from the absorber layer to the drift layer through the elimination of potential barriers and trapping discontinuities. The band diagram for one design of such a device is presented in FIG. 6 which shows both the conduction energy band, the valence energy band, and the average electrochemical potential for the device at equilibrium. In this diagram the InP:p substrate is located at $x<-2$ µm, the (InGa)As:p absorber in the region $-2$ µm$<x<0$, the alloy grading layer and built-in field layer in the vicinity of $x=0$, the InP:ø drift layer in the region $0<x<5$ µm, and the InP:n+ contact layer in the region $x \geq 5$ µm. The lack of potential barriers to carrier drift from the absorber layer to the drift layer is apparent from the conduction band of FIG. 6. This device will have significantly higher operational speed due to the low capacitance due to the thick drift region and low dark current due to the extrinsic nature of the absorber layer in comparison to conventional (InGa)As p-i-n detectors.

Figure 8:
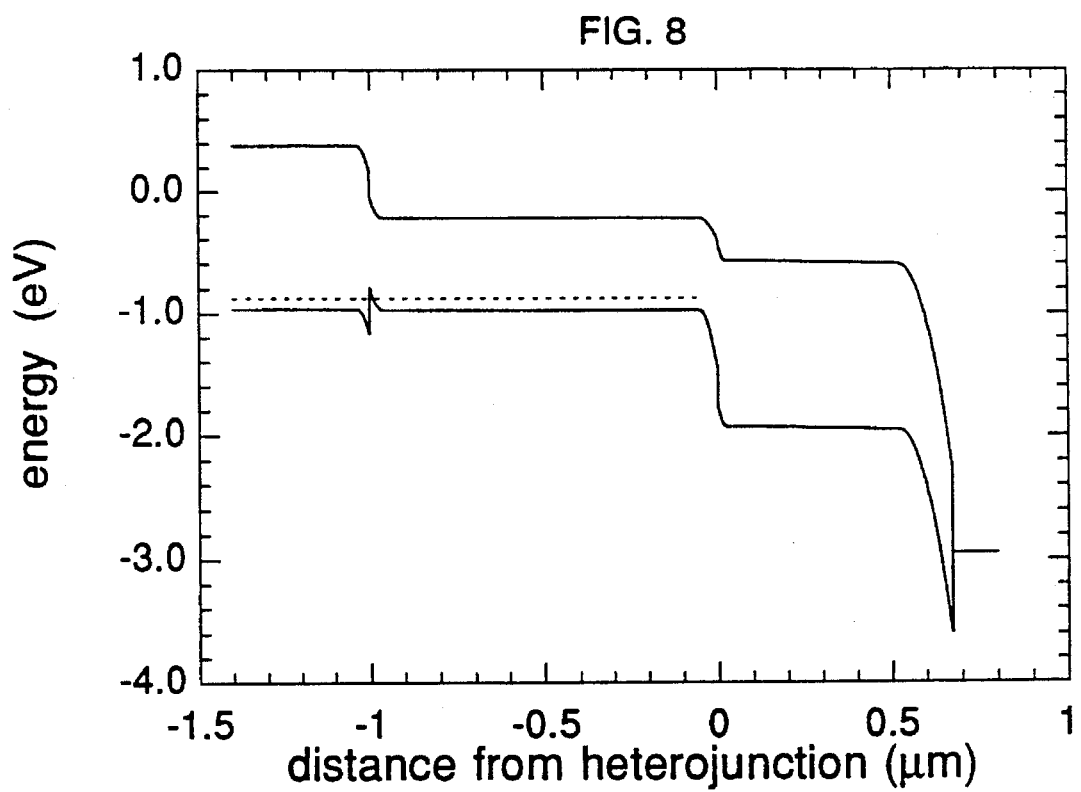
FIG. 8 is an energy level diagram of the transferred photocathode of FIG. 6 under the condition of 2.1 volt externally applied bias.

The transferred electron photocathode structure of FIG. 7 consists of a glass window 30, InP:p- substrate 32, substrate ohmic contact 34, absorber layer 14, semiconductor grading layer 16, built-in field layer 18, InP:ø drift region 20, high-field inP:p layer 44, Schottky barrier metalization 46, and cesium/cesium oxide activation layer 48. In this device light incident on the glass window 30 is generate photoelectrons in the (InGa)As absorber layer which must be transferred to the InP:ø drift layer and heated in the high-field InP:p layer to be emitted from the photocathode and contribute to the collected device current. This device requires an externally applied voltage of greater than 2 V applied to the Schottky barrier contact referenced to the substrate ohmic contact in order to create the high-field surface region and pull out potential barrier to electrons presented in equilibrium by the p-n-i-p structure. The energy band diagram for this device under an applied bias of 2 V is presented in FIG. 8. In this figure the InP:p substrate is situated in the region $x<-1$ µm, the absorber layer in the region $-1$ µm$<x<0$, the alloy grading layer and built-in field layer near $x=0$, the drift layer in the region $0<x<0.5$ µm, the InP:p high-field layer in the region $0.5$ µm$<x<0.65$ µm, and the Schottky barrier in the region $x>0.65$ µm. The elimination of potential barriers to photoelectrons drifting from the absorber layer to the drift layer is clear from the conduction band of this diagram..

It will be apparent to those skilled in the art that the objects of this invention have been achieved by providing a gradient in potential energy for conduction electrons travelling from an (InGa)As layer to an InP:ø layer for the purpose of increasing the efficiency of the electron collection. The current invention allows for the use of extrinsic low bandgap (InGa)As absorber layers and depleted large-bandgap InP:ø layer to reduce the collection of thermally generated current from depleted low-bandgap material, reduce the capacitance of the aggregate heterojunction, and improve the time response junction. In its most general form this invention can be used to efficiently transfer electrons from a small-bandgap large electron affinity semiconductor to a large-bandgap small electron affinity semiconductor.

What is claimed is:
1. A III-V semiconductor heterojunction structure comprising:
 a p-type (InGa)As electron source layer of conduction electrons through photogeneration or diffusion transport of electrons;
 a depleted p-type III-V semiconductor grading layer formed over the (InGa)As layer;
 a depleted n-type InP built-in field layer formed over the semiconductor grading layer;
 an undoped InP:ø electron collector layer formed over the built-in field layer.
2. The heterojunction structure of claim 1 in which
 the (InGa)As electron source layer is replaced with an (AlGaIn)As layer.
3. The heterojunction structure of claim 1 in which the (InGa)As electron source layer is replaced with an (InGa)(AsP) layer.
4. A p-i-n photodiode comprising:
 an InP:p substrate;
 a back-surface contact pad forming an ohmic contact to the substrate;
 an p-type (InGa)As absorber layer formed over the substrate;
 a depleted p-type III-V semiconductor grading layer formed over the (InGa)As layer;
 a depleted n-type InP built-in field layer formed over the semiconductor grading layer;
 an undoped InP electron collector layer formed over the built-in field layer;
 an n-type InP layer formed over the undoped collector layer;
 and an exposed surface ohmic contact to the n-type InP layer.
5. The photodiode structure of claim 4 in which
 said segment is within the n-type built-in field layer.
6. The photodiode structure of claim 4 in which
 said segment is within said depleted p-type semiconductor layer and said segment is implemented with a superlattice structure having graded layer thicknesses to yield a virtual alloy grade.
7. The photodiode structure of claim 4 in which
 the (InGa)As absorber layer is replaced with an (AlGaIn)As absorber layer.
8. The photodiode structure of claim 4 in which the (InGa)As absorber layer is replaced with an (InGa)(AsP) absorber layer.
9. A transferred-electron photocathode comprising: an InP:p substrate;
 an p-type (InGa)As absorber layer formed over the substrate;
 a contact pad forming an ohmic contact to the substrate or the absorber layer;
 a depleted p-type III-V semiconductor grading layer formed over the (InGa)As layer;
 a depleted n-type InP built-in field layer formed over the semiconductor grading layer;
 an undoped InP electron collector layer formed over the built-in field layer;
 a top-surface Schottky barrier over the undoped InP layer.
10. The photocathode structure of claim 9 in which
 said segment is within the n-type built-in field layer.
11. The photocathode structure of claim 9 in which said segment is within said depleted p-type semiconductor layer and said segment is implemented with a superlattice structure having graded layer thicknesses to yield a virtual alloy grade.

12. The photocathode structure of claim 9 in which the (InGa)As absorber layer is replaced with an (AlGaIn)As absorber layer.

13. The photocathode structure of claim 9 in which a p-type InP field layer is interposed between the undoped InP collector layer and the Schottky barrier.

14. The photocathode structure of claim 9 in which the (InGa)As absorber layer is replaced with an (InGa)(AsP) absorber layer.

15. A semiconductor heterojunction structure comprising:
   a p-type electron source layer;
   a depleted p-type semiconductor layer overlying said electron source layer;
   a depleted n-type semiconductor built-in field layer formed over said depleted p-type semiconductor layer; said depleted p-type semiconductor layer being positioned between said electron source layer and said built-in field layer, said depleted p-type semiconductor layer having a substantial electron affinity match at the surface thereof in contact with said electron source layer and a substantial electron affinity match at the surface thereof in contact with said built-in field layer; and
   an undoped electron collector layer formed over the built-in field layer, said undoped electron collector layer having a larger bandgap and a smaller electron affinity than said electron source layer, said built-in field layer having a substantial electron affinity match at the surface thereof in contact with said collector layer,
   and at least a graded segment of varying composition between
   (a) said surface of said depleted p-type semiconductor layer in contact with said electron source layer and
   (b) said surface of said built-in field layer in contact with said collector layer, to achieve differences in electron affinity.

16. The heterojunction structure of claim 15 in which said segment is within the n-type built in field layer.

17. The heterojunction structure of claim 15 in which said segment is within said depleted p-type semiconductor layer and said segment is implemented with a superlattice structure having graded layer thicknesses to yield a virtual alloy grade.

18. A semiconductor heterojunction structure in accordance with claim 15 in which said segment extends across said depleted p-type semiconductor layer and said depleted n-type semiconductor built-in field layer.

19. A semiconductor heterojunction structure in accordance with claim 15 in which said segment is entirely within said depleted p-type semiconductor layer.

20. A semiconductor heterojunction structure in accordance with claim 19 in which said segment extends across said depleted p-type semiconductor layer.

21. A semiconductor heterojunction structure in accordance with claim 15 in which said segment is entirely within said built-in field layer.

* * * * *

UNITED STATES PATENT AND TRADEMARK OFFICE
CERTIFICATE OF CORRECTION

PATENT NO. : 5,576,559
DATED : November 19, 1996
INVENTOR(S) : Gary A. Davis

It is certified that error appears in the above-indentified patent and that said Letters Patent is hereby corrected as shown below:

Column 8, line 38, change "said segment" to --a segment of said grading layer--.

Column 8, lines 40 and 41, change "segment" to --grading layer--.

Column 8, line 66, change "said segment" to --a segment of said grading layer--.

Column 9, lines 1 and 2, change "segment" to --grading layer--.

Signed and Sealed this

Eighth Day of July, 1997

*Attest:*

BRUCE LEHMAN

*Attesting Officer*   Commissioner of Patents and Trademarks